United States Patent
Plants

(10) Patent No.: US 10,409,677 B2
(45) Date of Patent: *Sep. 10, 2019

(54) ENHANCED MEMORY RELIABILITY IN STACKED MEMORY DEVICES

(71) Applicant: Invensas Corporation, San Jose, CA (US)

(72) Inventor: William C. Plants, Campbell, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/128,161

(22) Filed: Sep. 11, 2018

(65) Prior Publication Data

US 2019/0012232 A1    Jan. 10, 2019

Related U.S. Application Data

(63) Continuation of application No. 15/713,439, filed on Sep. 22, 2017, now Pat. No. 10,083,079, which is a continuation of application No. 15/340,883, filed on Nov. 1, 2016, now Pat. No. 9,778,984.

(51) Int. Cl.

| | | |
|---|---|---|
| *G11C 7/00* | (2006.01) |
| *G06F 11/10* | (2006.01) |
| *G11C 29/52* | (2006.01) |
| *G11C 5/02* | (2006.01) |
| *G11C 29/42* | (2006.01) |
| *G11C 29/44* | (2006.01) |
| *G11C 29/00* | (2006.01) |
| *H03M 13/29* | (2006.01) |
| *G11C 5/04* | (2006.01) |
| *G11C 11/401* | (2006.01) |

(52) U.S. Cl.
CPC ...... *G06F 11/1068* (2013.01); *G06F 11/1012* (2013.01); *G06F 11/1076* (2013.01); *G11C 5/025* (2013.01); *G11C 29/42* (2013.01); *G11C 29/4401* (2013.01); *G11C 29/52* (2013.01); *G11C 29/783* (2013.01); *H03M 13/2906* (2013.01); *G11C 5/04* (2013.01); *G11C 11/401* (2013.01)

(58) Field of Classification Search
USPC ............................ 365/189.14, 189.15, 189.16
See application file for complete search history.

(56) References Cited

U.S. PATENT DOCUMENTS

| | | |
|---|---|---|
| 8,448,045 B2 | 5/2013 | Reddy et al. |
| 9,606,928 B2 | 3/2017 | Eguchi |
| 9,870,163 B2 | 1/2018 | Arsovski et al. |
| 10,083,079 B2 * | 9/2018 | Plants .................. G11C 29/52 |
| 2008/0168331 A1 | 7/2008 | Vogelsang et al. |

OTHER PUBLICATIONS

"Hybrid Memory Cube Specification 2.1", Hybrid Memory Consortium, Altera Corporation, 2014, 132 pages.

(Continued)

*Primary Examiner* — Son T Dinh

(57) ABSTRACT

The invention pertains to semiconductor memories, and more particularly to enhancing the reliability of stacked memory devices. Apparatuses and methods are described for implementing RAID-style error correction to increase the reliability of the stacked memory devices.

17 Claims, 18 Drawing Sheets

(56) References Cited

OTHER PUBLICATIONS

JEDEC Standard: "Hybrid Bandwidth Memory (HBM) DRAM," JESD235A, (Revision of JESD235, Oct. 2013), Nov. 2015, 172 pages.
JEDEC Standard, "Low Power Double Data Rate," (LPDDR4), JESD209-4A, (Revision of JESD209-4, Aug. 2014), Nov. 2015, 272 pages.
Klein, Dean, "3DIC and the Hybrid Memory Cube," Micron Technology, Inc., Sep. 4, 2013, 30 pages.
Lee et al., "Simultaneous Multi-Layer Access: Improving 3D-Stacked Memory Bandwidth at Low Cost," ACM Trans. Archit. Code Optim.12, 4, Article 63, Dec. 2015, 29 pages.
Micron's "HMC Memory for Exascale: Hybrid Memory Cube", Sandia National Laboratories, Sand No. 2011-5219P, Jul. 8, 2011, 9 pages.
O'Connor, Mike, "Highlights of the High-Bandwidth Memory (HBM) Standard," The Memory Forum, nVidia, Jun. 14, 2014, 25 pages.
Powlowski, J. Thomas, "Hybrid Memory Cube (HMC)," Hot Chips 23, Micron Technology, Inc., Aug. 4, 2011, 24 pages.

\* cited by examiner

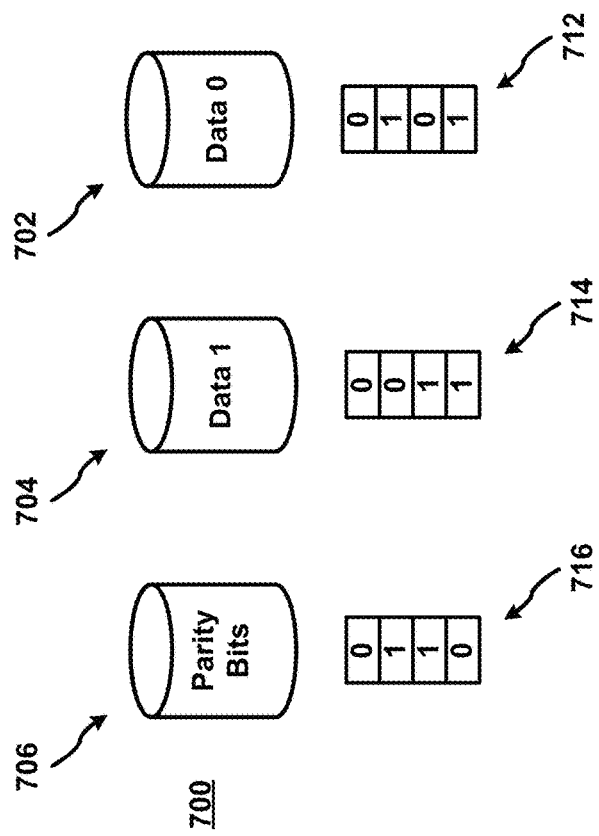

ENHANCED MEMORY RELIABILITY IN STACKED MEMORY DEVICES

CROSS-REFERENCE TO RELATED APPLICATION(S)

The present application is a continuation of U.S. patent application Ser. No. 15/713,439, filed Sep. 22, 2017, which is a continuation of U.S. patent application Ser. No. 15/340,883, filed Nov. 1, 2016, now U.S. Pat. No. 9,778,984, the disclosures of which are incorporated herein by reference in their entirety for all purposes.

FIELD

The invention pertains to semiconductor memories, and more particularly to enhancing the reliability of stacked memory devices.

BACKGROUND

In recent years as semiconductor geometries have shrunk, each subsequent generation has become increasingly costly to develop and bring into production. This makes the commercial demand for more memory at ever lower prices per bit harder for memory manufacturers to meet. One current solution is to expand upward by stacking memory chips one atop another in a single package. These memories can be coupled in a variety of technologies known in the art such as, for example, wire bonding, through-silicon via (TSVs), and the like.

While this can greatly increase the memory density in terms of bits per package footprint area, it creates additional problems that must be solved to create a commercially successful product. One such problem is the presence of defective memory chips in a stack. If a chip is tested and known to fail before assembly, it is easy to discard and replace it with a fully functional chip. Once the chips are packaged, if a chip fails then the entire stack can become defective—especially if there is insufficient in-field repair capability to repair or work around the bad chip. In such a case, all the good die in the stack may be discarded along with the bad one. This can be a particular difficulty in volatile memories like, for example, static random access memories (SRAM) and dynamic random access memories (DRAM). This is because these memories are often used as caches and the main memory for a processor, and programming models and operating systems assume that the entire installed memory space is fully functional.

FIG. 1 illustrates a representative DRAM integrated circuit (IC) 100 of a type known in the art. DRAM IC 100 comprises a memory array 102 of memory cells where individual bits of memory are stored. Memory array 102 is coupled to bit line/sense amplifier (BLSA) 104. The circuits in BLSA 104 are well known in the art and provide the means for addressing columns and for writing data into and reading data from memory array 102.

BLSA 104 is coupled to bidirectional input/output (I/O) bus 106 to allow data to be written to or read from DRAM IC 100 by the system in which DRAM IC 100 is operating. Memory array 102 is further coupled to word line (WL) drivers 108 which are used for addressing rows for reading and writing operations.

The conventional way of increasing yield is to provide a certain number of additional, or redundant, rows and columns that can be switched in to replace defective rows and columns respectively. In FIG. 1, redundant rows 110 and redundant columns 112 are shown as part of memory array 102. The redundant memory cells in area 114 are the intersection of redundant rows 110 and redundant columns 112 as they are part of both.

Typically, there is an overhead of about 3% redundant rows (e.g., 132/128=1.0313) and about 3% redundant columns for a memory cell overhead of about 6% ($1.0313^2=1.0635$). In practice, all of the redundant bits are usually swapped in before the memory device is shipped to a customer. First defective bits that are tested and found non-functional are replaced; then the weakest bits that are identified by further testing are replaced with the remaining redundant bits to increase reliability. Typically, no in-field repair is done for individual commercial memory chips.

The circuitry in area 116 is used for controlling memory array 102 and its related circuits. Persons skilled in the art will realize that DRAM IC 100 is an abstraction and that many necessary circuits known in the art are omitted for simplicity.

FIG. 2 illustrates a representative memory module of a type known in the art as a Registered Dual In-line Memory Module (RDIMM) with Error Correction Coding (ECC). Memory module 200 comprises a printed circuit board (PCB) 202 with two portions 204A and 204B comprising two parts of an edge connector separated by an alignment notch 206. Memory module 200 is typically inserted into a socket (not shown) on another PCB (not shown) and the edge connector portions 204A and 204B provide electrical connections to the rest of the system (not shown). Alignment notch 206 is placed off-center to prevent incorrect insertion into the socket.

PCB 202 has a variety of integrated circuits mounted thereon in addition to many passive components (not shown) like, for example, decoupling capacitors. There are DRAM ICs 208, ECC ICs 210, a Serial Presence Detection (SPD) EEPROM 212, and a register IC (REG) 214. The DRAMs 208 are of a type known in the art like, for example, DRAM IC 100 in FIG. 1. Typically, in an RDIMM with ECC the DRAMs 208 are partitioned into nine groups each having an associated ECC IC 210. This allows storage of a 72/64 Hamming ECC as known in the art. Each 64-bit data word is encoded into a 72-bit data word with eight parity bits which is sufficient to perform a Single Error Correction Double Error Detection (SECDED) for each original 64-bit data word. The parity bits are stored in the additional memory capacity provided by the ninth group of DRAMs 208. The ECC works to increase the reliability of the RDIMM beyond the reliability imparted due to the redundant rows and columns in the DRAM ICs 208.

Each group of DRAMs typically comprises one, two, or four DRAM ICs 208 depending on the capacities of the individual DRAMs 208 and the desired capacity of the RDIMM 200 itself. In the example in FIG. 2, two DRAMs 208 are shown mounted on the front of PCB 202 for each of the nine groups. Optionally there could be another two DRAMs 208 (not shown) mounted on the rear of PCB 202. Likewise, there could be only a single DRAM 208 associated with each of the nine ECC ICs 210.

SPD EEPROM 212 is typically present in JEDEC standard Dual In-line Memory Modules (DIMM) of all types as is known in the art. SPD 212 allows the memory controller to serially access data stored in the EEPROM concerning the type of DIMM present in any socket and use the data to properly control it. The register IC 214 is used to ease timing constraints by pipelining read and write data. It is present in RDIMMs (hence the "R" in RDIMM) as well as other types of DIMM.

FIG. 3 illustrates a subsystem 300 comprising an applications processor 302 in a package and a Low Power Double Data Rate 4 (LPDDR4) DRAM 304 in a Package on Processor (PoP) package. The DRAM 304 package is itself mounted on the applications processor 302 package as known in the art. Subsystem 300 is suitable for use in an information processing device like, for example, a cell phone or a tablet computer. LPDDR4 DRAM 304 is shown comprising error correction circuit 306 coupled between memory array 308 and application processor 302.

The JEDEC Low Power Double Data Rate (LPDDR4) Standard (JESD209-4A, November 2015) includes a masked write command (MWR). This command takes longer to complete than a normal write which allows extra time to access an entire data word, replace the old data with new in bytes to be overwritten while keeping the old data for bytes to be masked, recalculate the parity bits for the entire data word, and then write the entire data word plus parity back into the memory. While no LPDDR4 products with the ECC feature have yet appeared in the market, prototypes have been discussed in the literature and the possibility of using the MWR command this way is mentioned in the JEDEC Standard.

Like memory array 102 in FIG. 1, memory array 308 also has redundant rows and columns that are used in a substantially similar manner. Error correction circuit 306 works to increase the reliability of subsystem 300 beyond the reliability imparted due to the redundant rows and columns in memory array 308.

FIG. 4 illustrates an abstraction of a stacked memory device 400 in a single package (not shown). Stacked memory device 400 comprises a controller IC 402 on which an exemplary stack of four DRAM ICs 404A, 404B, 404C and 404D are mounted (though there may be other numbers of DRAM ICs 404 as a matter of design choice).

Controller IC 402 and DRAM ICs 404A, 404B, 404C and 404D are electrically coupled together vertically using Through Silicon Via (TSV) interconnects, an exemplary one of which couples to controller IC 402 at 406A, couples to the top DRAM IC 404D at 406B, and couples to DRAM ICs 404A, 404B and 404C in between. Although other interconnect technologies could be used for interconnection in stacked memory device 400, TSV seems to be the technology that the major memory manufacturers are pursuing for higher density memories in products such as the Hybrid Memory Cube and High Bandwidth Memory.

FIG. 5 illustrates an abstract view of a Hybrid Memory Cube (HMC) product 500 according to the *Hybrid Memory Cube Specification* 2.1, October 2015, published by the Hybrid Memory Cube Consortium. HMC product 500 comprises a single package (not shown) with a base logic IC 502 and four stacked DRAMs 504A, 504B, 504C and 504D and is organized into a number of vertical partitions known as vaults 506. The base logic IC 502 comprises a vault controller 508 for each vault which in turn manages all of its associated vault DRAM partitions 510A, 510B, 510C and 510D located on DRAMs 504A, 504B, 504C and 504D respectively. Communication between the vault controller 508 and the DRAM partitions 510A, 510B, 510C and 510D is achieved with wide vertical busses implemented in TSVs (not shown), while communication between the vault controllers 508 and the system (not shown) is implemented with high speed serial links (not shown).

Although details are scarce in the literature, there are a number of enhanced reliability features in HMC product 500. Each vault is capable of self-repair and has Hamming ECC. This implies that a higher percentage of redundant rows and columns are present in the DRAM partitions 510A, 510B, 510C and 510D than in conventional DRAM 100 in FIG. 1. Thus the ECC can enhance reliability by covering for a bit that fails during normal operation until the vault controller can schedule a self-repair operation. Effectively the ECC does double duty by covering for soft errors as in RDIMM 200 or DRAM 300 discussed above, as well as temporarily masking hard errors until repaired.

HMC product 500 also contains self-repair capability if a vertical TSV bus line fails by allocating redundant TSV bus lines. Additionally, the HMC product 500 performs parity checking on address and command lines to the DRAM partitions 510A, 510B, 510C and 510D, which allows vault controller 508 to retry read and write operations incorrectly received by one of the memory partitions. The vault controller 508 also does diagnostics on the high speed links to either correct any problem or, in the worst case, shut the link down.

FIG. 6 illustrates an abstract view of a High Bandwidth Memory (HBM) product 600 according to the JEDEC High Bandwidth Memory (HBM) DRAM Standard JESD235A, November 2015. HBM product 600 comprises a base logic IC 602 and four DRAM ICs 604A, 604B, 604C and 604D each comprising memory array 606A, 606B, 606C and 606D respectively in a single package (not shown). According to the Standard, base logic IC 602 is optional and its functionality can be located outside the package elsewhere in the system (not shown). Vertical communication is implemented with vertical bus lines using TSVs (not shown).

While few details are given in the literature there are a number of enhanced reliability features in HBM product 600. It has self-repair capability implying a higher percentage of redundant rows and columns in memory arrays 606A, 606B, 606C and 606D than in conventional DRAM 100 in FIG. 1. HBM product 600 supports ECC by providing 16 additional bits per 128 data bits, though the ECC computations are done in the host processor. This number of bits is sufficient to implement two 72/64 Hamming ECCs, or a more sophisticated ECC scheme operating on all 128 bits as known in the art could be used as a function of the software. HBM product 600 also contains self-repair capability if a vertical TSV bus line fails by allocating redundant vertical bus lines.

RAID (redundant array of independent disks) is a venerable technology used to guard against data loss in the event of hard disk failures in high end computers and data centers. The use of RAID-style technology has been mentioned in the literature as an area for investigation to improve the reliability of high density memory products, but no embodiments or methods of use have been disclosed.

RAID actually covers a wide variety of different techniques (some standardized and some proprietary) that provide differing degrees of reliability at different price points. The three most commonly encountered are the standardized RAID 1, RAID 5 and RAID 6.

RAID 1 is often called disk mirroring. Two hard disk drives (HDDs) are controlled in parallel with the same data written to and read from both. If one of the HDDs fails, it can be replaced and then the data can be transferred to the new HDD from the other old HDD. There is a risk of data loss if the second old HDD fails before the data is transferred. This is a relatively inexpensive reliability feature, which can be found typically in business PCs and workstations.

RAID 5 requires at least three HDDs to function: two data disks and one parity disk, though additional data HDDs may be added. The parity data is a bit-by-bit XOR of all the data on all the data disks which is then stored on the parity disk.

If any of the disks fails, it can be replaced with the system on and active (a so-called "hot-swap") and reconstructed without data loss and without stopping or powering down the system. Data loss can occur if a second disk fails before the new disk is reconstructed. RAID 5 is a medium tier reliability feature disk arrays typically used by small-to-medium sized business.

FIG. 7 illustrates an abstraction of a RAID 5 disk array 700 as known in the art. This is the simplest case RAID 5 configuration. Disk array 700 comprises two data HDDs 702 and 704 and a parity HDD 706. The three tables 712, 714 and 716 show the bit-by-bit relationship between individual bits on each drive. Initially, the data on parity disk 706 would be created by applying an XOR function bit-by-bit for all the data on data disks 702 and 704. Once the parity data on disk 706 has been created, notice that any data bit on any of the three HDDs 702, 704 and 706 can be reconstructed from the other two disks by performing a bit-by-bit XOR of the good bits and writing them bit-by-bit to the newly replaced disk. This is due to the parity preservation property of the XOR function. Notice that the parity of each of the three rows across tables 712, 714 and 716 is even (that is, there is an even number of logic-1 bits present: 0, 2, 2 and 2 from top to bottom). This is true for any number of inputs to the XOR function. So if there is an error, the correct data for each bit on the replacement disk is the binary value that will make the overall parity even.

RAID 6 requires at least four HDDs to function: two data disks and two parity disks, though additional data HDDs may be added. In this double parity scheme, one of the parity disks is created as per RAID 5, while the second parity disk is created using a different parity algorithm. This arrangement allows any two HDDs to fail without losing data or availability. The use case is to allow the system operator to quickly hot-swap a failed disk while still maintaining redundancy should a second disk fail during the recreation of the first new disk. Thus it would take three simultaneous disk failures for the disk array to fail, a highly unlikely event. RAID 6 is a high-end technique typically found in enterprise class disk arrays, in data centers, and applications where data loss or inaccessibility is unacceptable.

DESCRIPTION OF THE DRAWINGS

FIG. 7 illustrates an abstraction of a RAID 5 disk array as known in the art.

DETAILED DESCRIPTION

Those of ordinary skill in the art will realize that the following figures and descriptions of exemplary embodiments and methods of the present invention are illustrative only and not in any way limiting. Other embodiments will readily suggest themselves to such skilled persons after reviewing this disclosure.

Figure 8A:
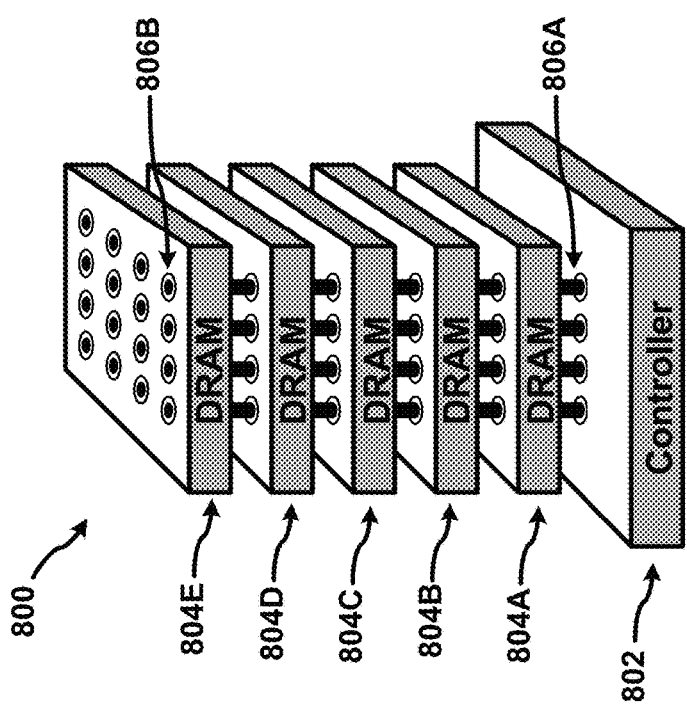
FIGS. 8A, 8B and 8C illustrate different aspects of a first embodiment of a stacked memory device according to the present invention.

FIG. 8A illustrates an abstraction of an exemplary stacked memory device 800 according to the present invention. Stacked memory device 800 comprises a single package (not shown) with a base logic IC 802 and five stacked DRAM ICs 804A, 804B, 804C, 804D and 804E. Controller IC 802 and DRAM ICs 804A, 804B, 804C, 804D and 804E are electrically coupled together vertically using Through Silicon Via (TSV) interconnects, an exemplary one of which couples to controller IC 802 at 806A, couples to the top DRAM IC 804E at 806B, and couples to DRAM ICs 804A, 804B, 804C and 804D in between. Those skilled in the art will realize that other interconnect technologies besides TSV could be used for interconnection in stacked memory device 800.

Figure 1:
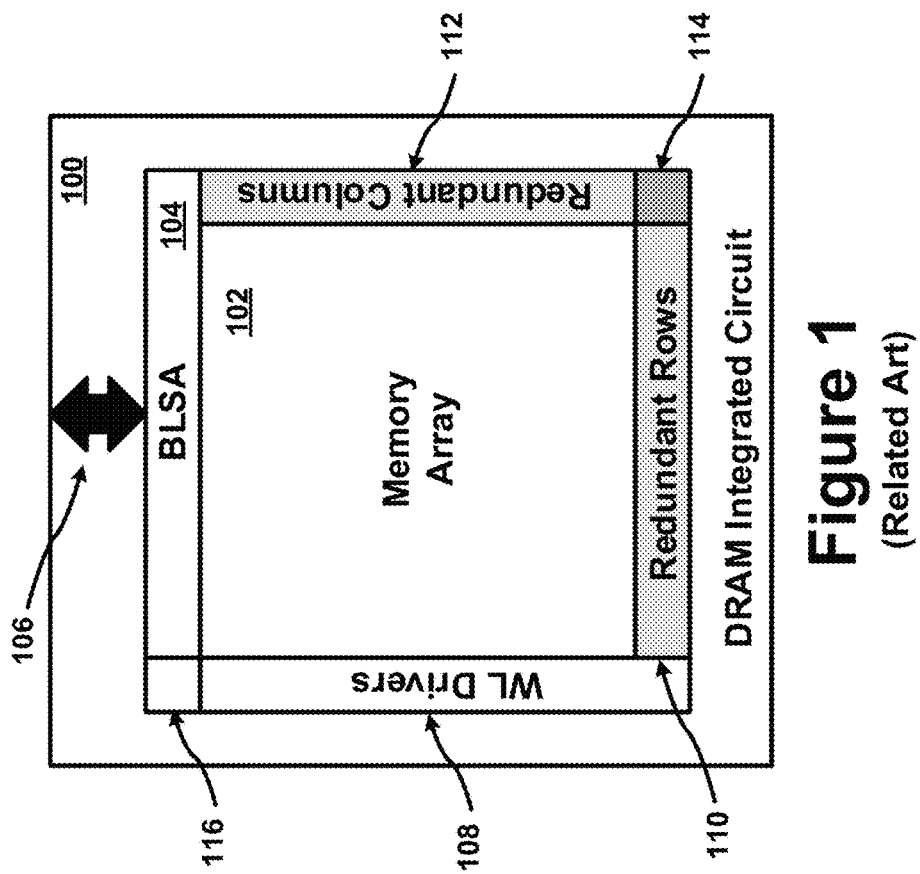
FIG. 1 illustrates a representative DRAM integrated circuit of a type known in the art.
Figure 2:
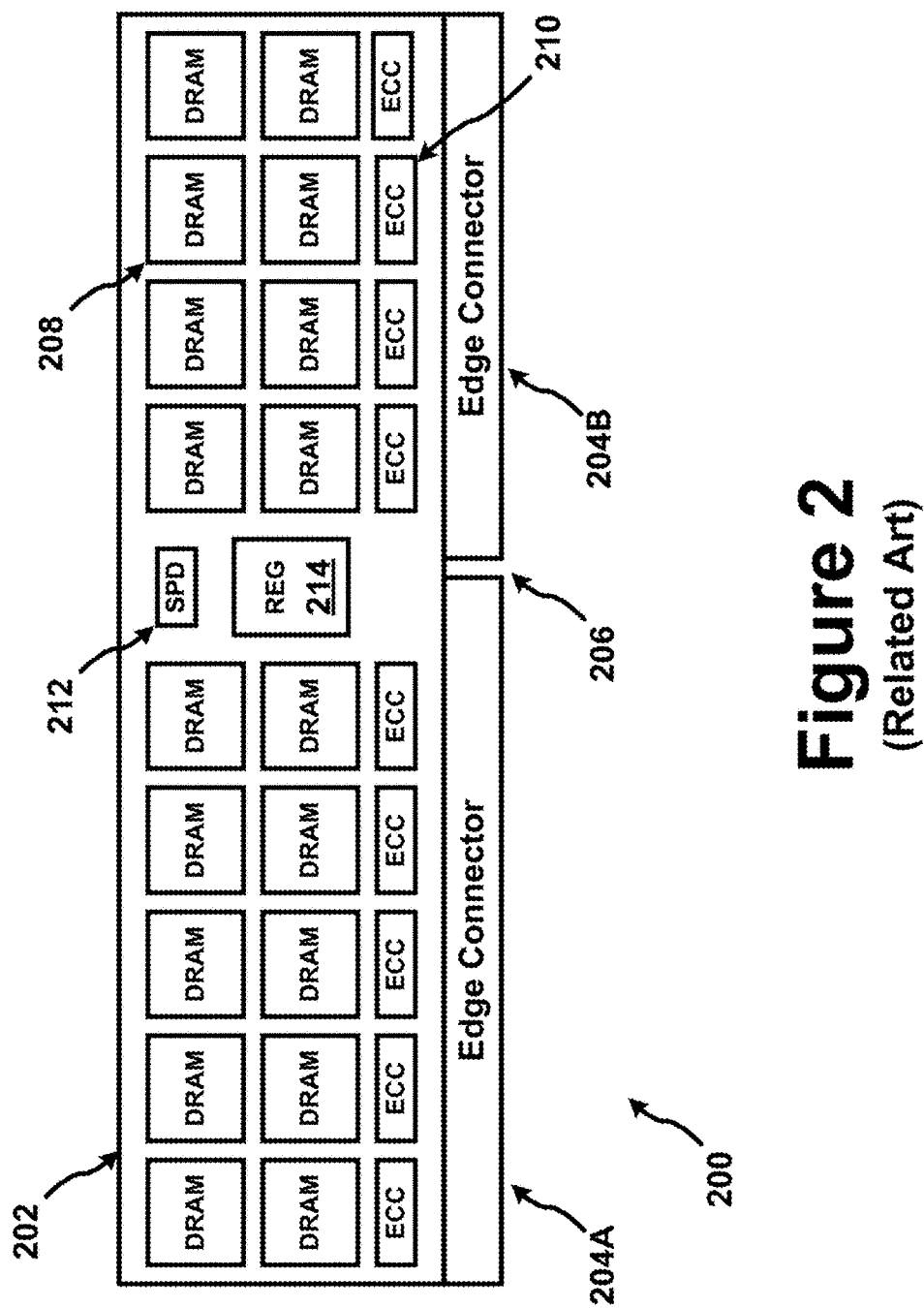
FIG. 2 illustrates a representative memory module of a type known in the art.
Figure 3:
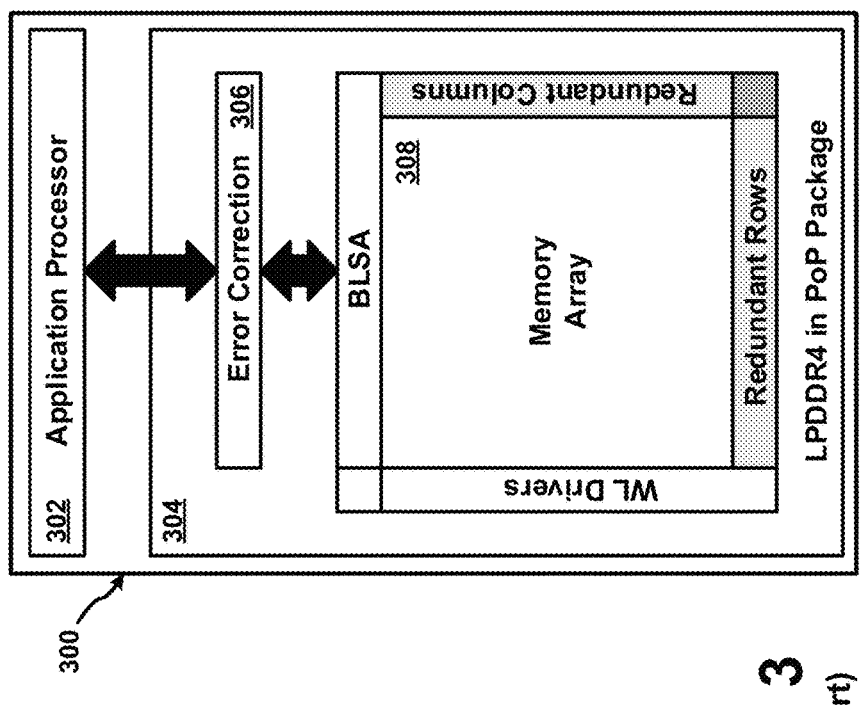
FIG. 3 illustrates a subsystem comprising an applications processor in a package and a LPDDR4 DRAM in a Package on Processor (PoP) package itself mounted on the applications processor package as known in the art.
Figure 4:
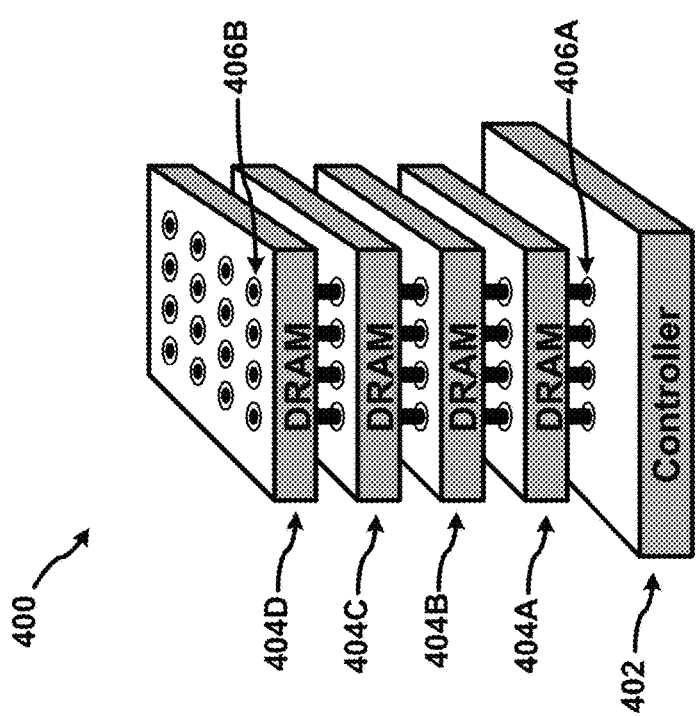
FIG. 4 illustrates an abstract stacked memory device as known in the art.
Figure 5:
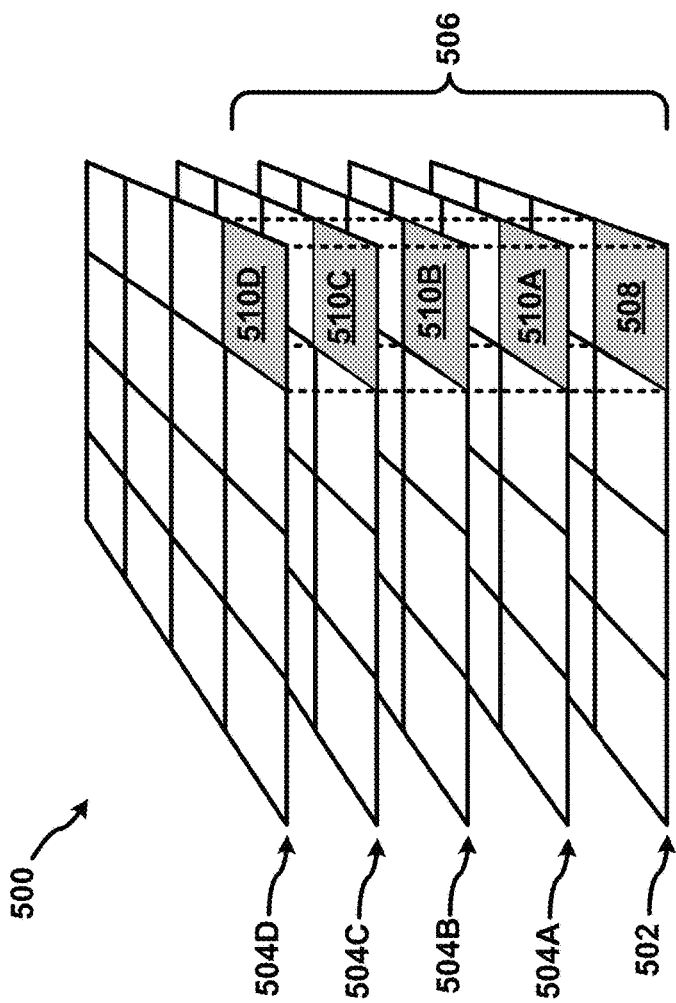
FIG. 5 illustrates a Hybrid Memory Cube (HMC) product known in the art.
Figure 6:
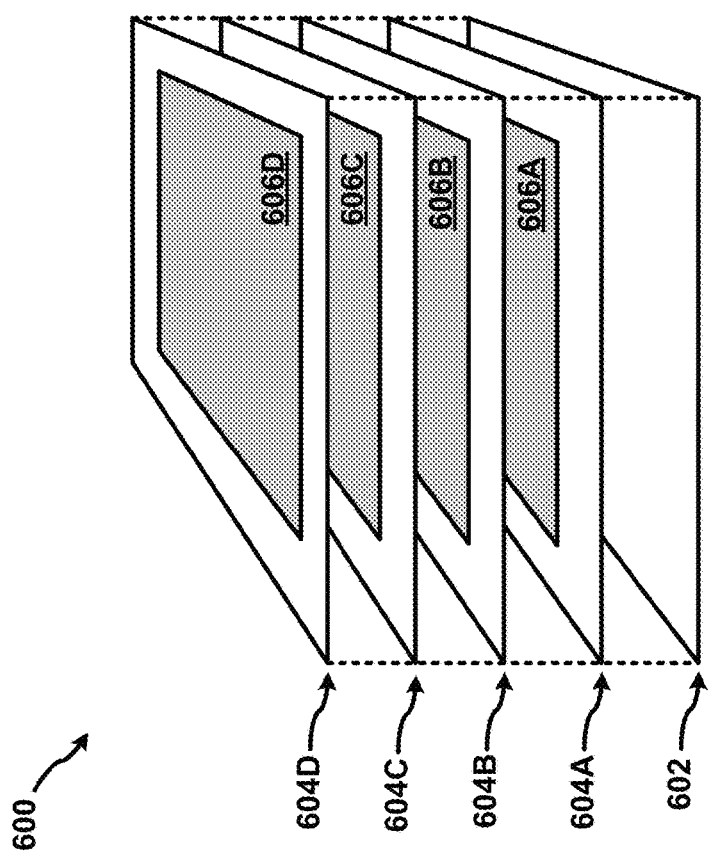
FIG. 6 illustrates a High Bandwidth Memory (HBM) product known in the art.

Compared to prior art devices like DRAM IC 400 in FIG. 4, stacked memory device 800 comprises an additional DRAM 804E which increases the memory capacity to provide room to store bit-by-bit parity data for the other DRAMs in the stack. This parity data is used to implement a full stack ECC scheme in a manner analogous to a RAID 5 disk array. This provides additional reliability beyond whatever other reliability features are provided on DRAM ICs 804A, 804B, 804C, 804D and 804E and/or on controller 802.

One additional DRAM is required for a stack of any height. Preferably the ECC scheme can be dynamically enabled or disabled. This allows the extra DRAM 804E to be substituted for one of the other DRAMs 804A, 804B, 804C and 804D if one of them should become damaged beyond the ability of whatever in-field repair capability is available to correct.

Persons skilled in the art will realize that different configurations are possible in other embodiments of the present invention. For example, a second additional DRAM IC (not shown) could be added to a stacked memory device to implement a corrections scheme analogous to a RAID 6 disk array, with appropriate logic modifications made to the controller IC. In such a configuration, if a DRAM IC in the stack were to fail, one of the parity DRAM ICs could be swapped in to replace it while the remaining parity DRAM IC could be used to run the entire stack in a RAID 5 analogous mode. Such skilled persons will further realize that many such configurations are possible using different parity schemes and numbers of DRAM ICs and that all of them fall within the scope of the present invention.

Figure 8B:
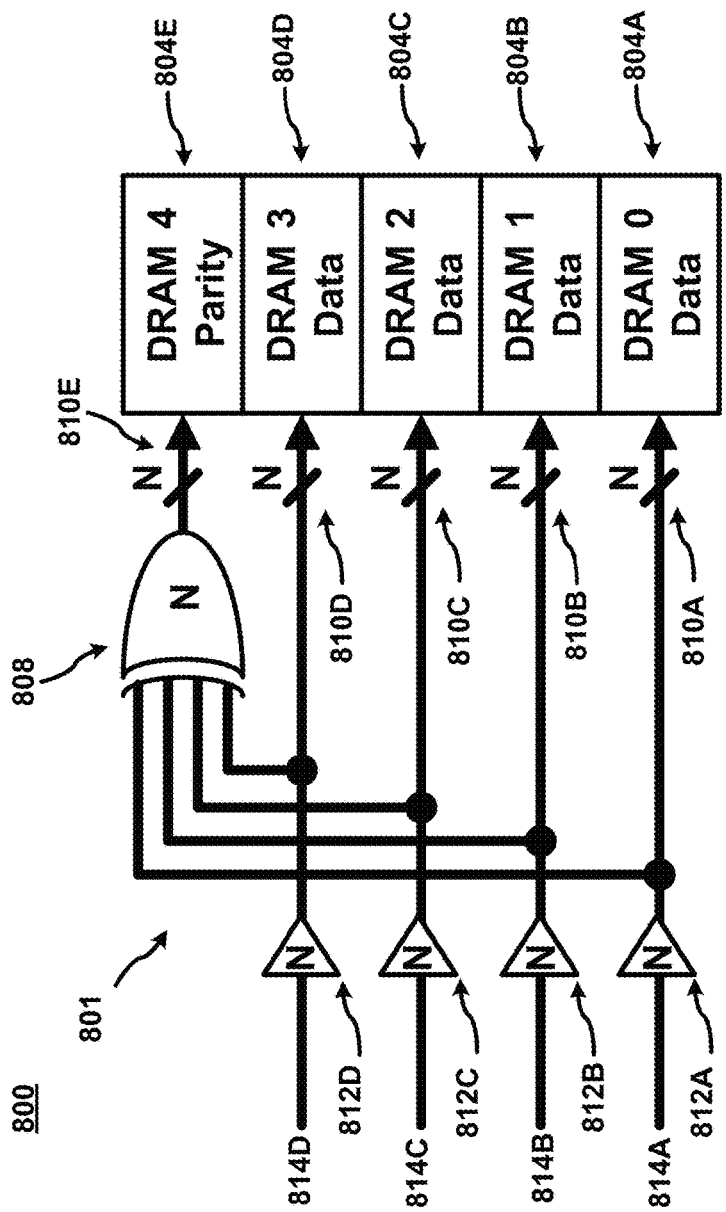

FIG. 8B illustrates an exemplary write logic circuit 801 for implementing the full stack ECC scheme in stacked memory device 800. The figure shows a portion of the stacked memory device 800 including DRAM ICs 804A, 804B, 804C, 804D and 804E, a plurality of N four-input XOR gates 808, and a plurality of four groups of N buffers 812A, 812B, 812C and 812D. This configuration may be used, for example, when the stacked DRAM ICs 804A, 804B, 804C, 804D and 804E are each coupled to its own dedicated N-bit wide write data bus 810A, 810B, 810C, 810D and 810E respectively for transporting write data during a write operation. The data busses 810A, 810B, 810C and 810D are each coupled to and driven by the outputs of their own pluralities of N buffers 812A, 812B, 812C and 812D respectively. The inputs of the pluralities of N buffers 812A, 812B, 812C and 812D are coupled to external input data busses 814A, 814B, 814C and 814D respectively.

The outputs of the plurality of buffers 812A, 812B, 812C and 812D are each further coupled to one input of one of the plurality of the four-input XOR gates 808 according to bit position through N-bit wide data busses 810A, 810B, 810C, 810D respectively. The most significant bit (MSB) of data bus 810E is coupled to the output of the four-input XOR GATE of the plurality of N four-input XOR gates 808 which in turn has its four inputs coupled to the most significant bits (MSBs) of the data busses 810A, 810B, 810C and 810D. Similarly, the next most significant bit of data bus 810E is coupled to the output of the four-input XOR GATE of the plurality of N four-input XOR gates 808 which in turn has its four inputs coupled to the next most significant bits of the data busses 810A, 810B, 810C and 810D. This manner of interconnection continues down the significance of the bit positions until the least most significant bit (LSB) of data bus 810E is coupled to the output of the four-input XOR GATE of the plurality of N four-input XOR gates 808 which in turn has its four inputs coupled to the least significant bits (LSBs) of the data busses 810A, 810B, 810C and 810D. This preservation of bit positions at both inputs and outputs when busses pass through or interact with a logic or memory circuit is consistently maintained throughout the exemplary stacked memory device 800.

The plurality of N four-input XOR gates 808 generates the bit-by-bit parity data to be stored in DRAM 804E based on the user data to be stored in DRAMs 804A, 804B, 804C and 804D. Persons skilled in the art will realize that the distribution of data in FIG. 8B is not the only possible data organization. For example, the parity data and user data could be broken into groups, and the data in different groups could be stored in a manner so that the parity data is distributed among the five DRAMs 804A, 804B, 804C, 804D and 804E instead of being concentrated in a single DRAM. Such skilled persons will realize that many such data distributions are possible with appropriate changes to the control logic, and that all such distributions fall within the scope of the invention.

Figure 8C:
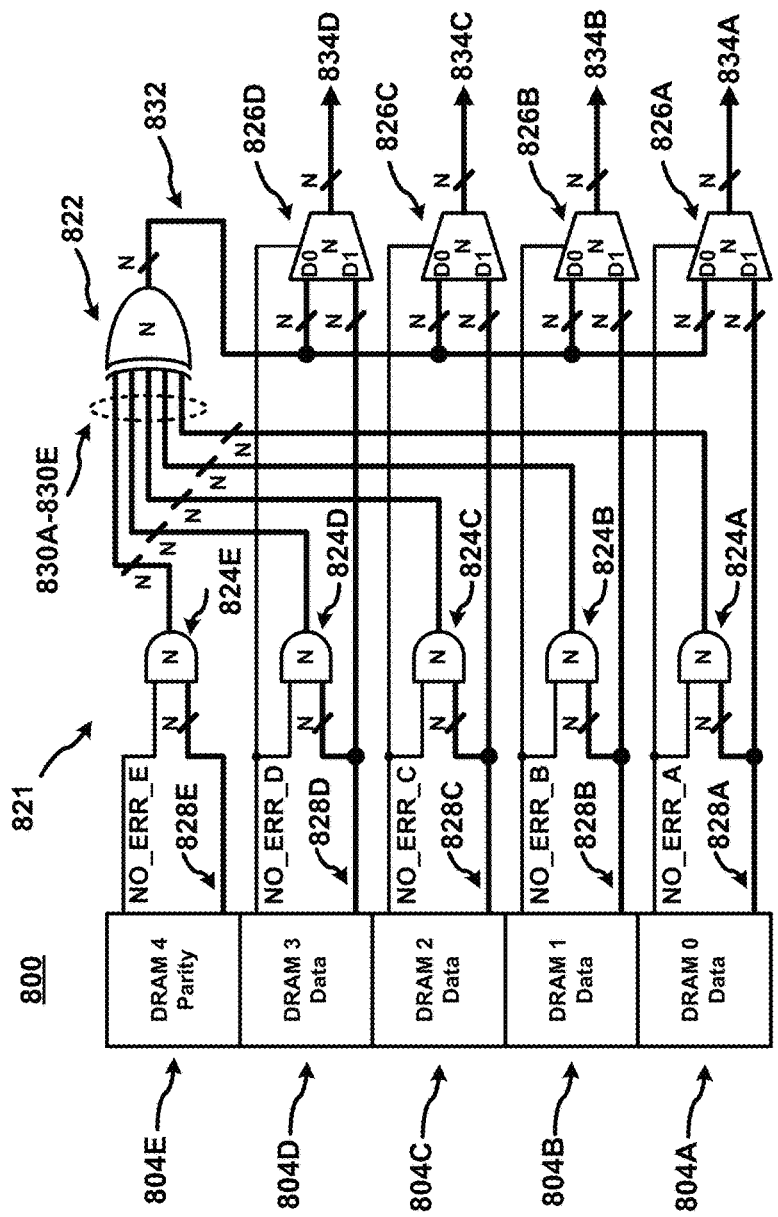

FIG. 8C illustrates an exemplary read logic circuit 821 for implementing the full stack ECC scheme in stacked memory device 800. The figure shows a portion of the stacked memory device 800 including DRAM ICs 804A, 804B, 804C, 804D and 804E, a plurality of N five-input XOR gates 822, five pluralities of N two-input AND gates 824A, 824B, 824C, 824D and 824E, and four pluralities of N 2:1 multiplexers 826A, 826B, 826C and 826D.

DRAM ICs 804A, 804B, 804C, 804D and 804E are coupled to N-bit read data busses 828A, 828B, 828C, 828D and 828E respectively for transporting read data during a read operation. Each signal in N-bit data busses 828A, 828B, 828C, 828D and 828E is further coupled to one input of one AND gate in the pluralities of N two-input AND gates 824A, 824B, 824C, 824D and 824E respectively. Each signal in N-bit data busses 828A, 828B, 828C and 828D is also coupled to the D1 input of one of the 2:1 multiplexers of the pluralities of N 2:1 multiplexers 826A, 826B, 826C and 826D respectively.

Each plurality of N two-input AND gates 824A, 824B, 824C, 824D and 824E drives the N-bit parity busses 830A, 830B, 830C, 830D and 830E respectively which are in turn coupled to the inputs of the plurality of N five-input XOR 822. The outputs of the plurality of N five-input XOR gates 822 are coupled to N-bit data correction bus 832. As was the case in FIG. 8B, the bit positions in all of these busses are only coupled to logic gates in turn coupled the signals of the same bit position in other busses. For example, the five-input XOR gate 822 coupled to the MSB of N-bit data correction bus 832 has its inputs coupled to the five MSBs of the five N-bit parity busses 830A, 830B, 830C, 830D and 830E and so on down to the LSBs of each of the busses.

N-bit data correction bus 832 is coupled to the D0 inputs of the four pluralities of N 2:1 multiplexors 826A, 826B, 826C and 826D. The outputs of the four pluralities of N 2:1 multiplexors 826A, 826B, 826C and 826D are coupled to external data busses 834A, 834B, 834C and 834D respectively. The bit order from MSB to LSB in these pluralities of busses and gates is preserved here as it is everywhere else in read logic circuitry 821 and in stacked memory device 800 in general. For example, the MSB of external data bus 834A is coupled to the multiplexor in the plurality of N 2:1 multiplexers 826A whose D0 input is coupled to the MSB of N-bit data correction bus 832 and whose D1 input is coupled to the MSB of data bus 828A, and so on down through the bit positions to the LSB position of the 834A, 832 and 828A busses.

In a similar manner the pluralities of N 2:1 multiplexors 826B, 826C and 826D have their outputs coupled to external data busses 834B, 834C and 834D respectively, their D0 inputs coupled to N-bit data correction bus 832, and their D1 inputs coupled to data busses 828B, 828C and 828D respectively. In all cases bit order is maintained in sequence from MSB to LSB in the various couplings.

DRAM ICs 804A, 804B, 804C, 804D and 804E each output a no-error control signal NO_ERR_A, NO_ERR_B, NO_ERR_C, NO_ERR_D and NO_ERR_E respectively. The five no-error control signals NO_ERR_A, NO_ERR_B, NO_ERR_C, NO_ERR_D and NO_ERR_E are each coupled to one input on each two-input AND gate of the five pluralities of N two-input AND gates 824A, 824B, 824C, 824D and 824E respectively. The four no-error control signals NO_ERR_A, NO_ERR_B, NO_ERR_C, NO_ERR_D are further coupled to the select inputs of each 2:1 multiplexor of the four pluralities of N 2:1 multiplexors 826A, 826B, 826C and 826D respectively.

The no-error control signals NO_ERR_A, NO_ERR_B, NO_ERR_C, NO_ERR_D and NO_ERR_E are generated by circuitry internal to (not shown) their respective DRAM ICs 804A, 804B, 804C, 804D and 804E. Each no-error control signal is driven to a logic-1 voltage level if the read data is correct, meaning that the internal redundancy circuits and resources were able to adequately correct the errors, if any, in the read data. Thus the four no-error control signals NO_ERR_A, NO_ERR_B, NO_ERR_C and NO_ERR_D will select the D1 inputs of the pluralities of N 2:1 multiplexors 826A, 826B, 826C and 826D respectively, thereby passing the correct data on N-bit read data busses 828A, 828B, 828C and 828D to external output data busses 834A, 834B, 834C and 834D respectively.

The five no-error control signals NO_ERR_A, NO_ERR_B, NO_ERR_C, NO_ERR_D and NO_ERR_E also gate the read data by means of the five pluralities of N two-input AND gates 824A, 824B, 824C, 824D and 824E respectively on the five N-bit data busses 828A, 828B, 828C, 828D and 828E respectively to be passed onto the plurality of N 5-input XOR gates 822. When the no-error control signal for a particular DRAM is logic-1, the correct read data is passed along so it is available for correcting erroneous read data from a different DRAM, if any.

When the no-error control signal for a particular DRAM IC is logic-0, the associated plurality of N 2-input AND gates force all of the bits on the associated N-bit parity bus 830x to logic-0. This removes the erroneous data from the parity calculations performed by the plurality of 5-input XOR gates 822, so that the correct data can be reconstructed from correct read data from the other DRAMs. The no-error control signal for DRAM IC also selects the D0 channel on the associated plurality of N 2:1 multiplexors 826x to allow the corrected data word to pass from N-bit data correction bus 832 to the N-bit external data bus 834x.

The value of N in stacked memory device 800 represents the width of a data word and is a matter of design choice. Furthermore, while stacked memory device 800 comprises four data memory integrated circuits 804A, 804, 804C, and 804D, any other number of data memory integrated circuits greater than or equal to two can be used as a matter of design choice.

While stacked memory device 800 is shown with unidirectional data input and output busses and sub-busses, those skilled in the art will realize that most DRAM memories utilize bidirectional data busses externally and that stacked memory device 800 could also be implemented in such a manner. For example, the N-bit wide external input data busses 814A, 814B, 814C and 814D may share the same physical wires as data output busses external input data busses 834A, 834B, 834C and 834D respectively. Similarly, the N-bit wide write data busses 810A, 810B, 810C, 810D and 810E may share the same physical wires as the N-bit read data busses 828A, 828B, 828C, 828D and 828E respectively. In such cases, the circuitry may be modified slightly to accomplish the bidirectional function using circuit techniques well known in the art.

DRAM ICs 804A, 804B, 804C, 804D and 804E each comprise a plurality of address locations which have not been illustrated in the figures to avoid overly complicating the disclosure with circuits that are well known in the art. In describing the write logic circuit 801 and read logic circuit 821, the write and read operations described apply to one particular address in all of the DRAM ICs 804A, 804B, 804C, 804D and 804E. The write operation encodes the data for a particular set of data words, the parity bits generated are unique to each set of data words, the read operation corrects any errors in that same particular set of data words using those same unique parity bits, and this is true for every set of data words at every address in stacked memory device 800.

Figure 9A:
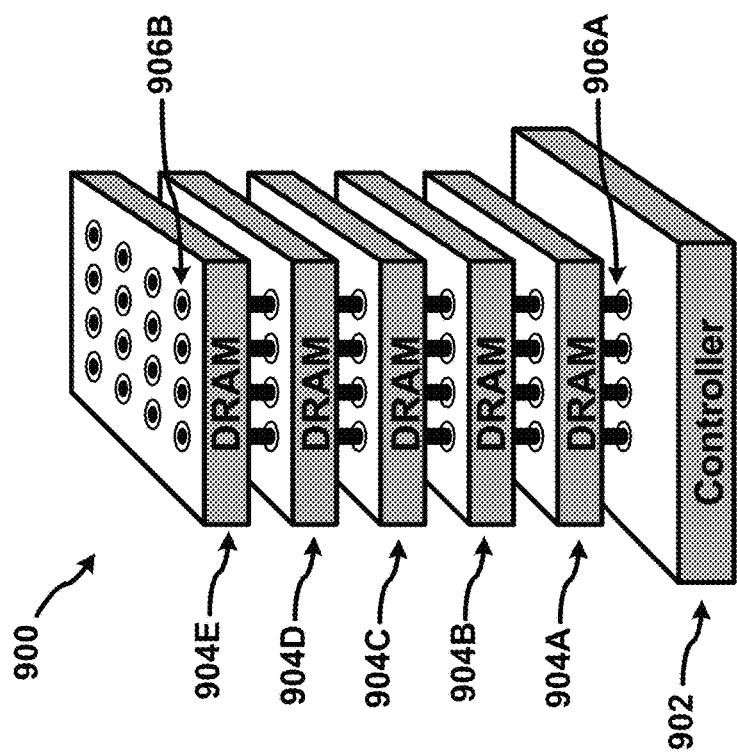
FIGS. 9A, 9B and 9C illustrate different aspects of a second embodiment of a stacked memory device according to the present invention.

FIG. 9A illustrates an abstraction of an exemplary stacked memory device 900 according to the present invention. Stacked memory device 900 comprises a single package (not shown) with a base logic IC 902 and five stacked DRAM ICs 904A, 904B, 904C, 904D and 904E. Controller IC 902 and DRAM ICs 904A, 904B, 904C, 904D and 904E are electrically coupled together vertically using Through Silicon Via (TSV) interconnects, an exemplary one of which couples to controller IC 902 at 906A, couples to the top DRAM IC 904E at 906B, and couples to DRAM ICs 904A, 904B, 904C and 904D in between. Those skilled in the art will realize that other technologies besides TSV could be used for interconnection in stacked memory device 900.

Compared to prior art devices like DRAM IC 400 in FIG. 4, stacked memory device 900 comprises an additional DRAM 904E which increases the memory capacity to provide room to store bit-by-bit parity data for the other DRAMs in the stack. This parity data is used to implement a full stack ECC scheme in a manner analogous to a RAID 5 disk array. This provides additional reliability beyond whatever other reliability features are provided on DRAM ICs 904A, 904B, 904C, 904D and 904E and/or on controller 902.

Only one additional DRAM is required for a stack of any height. Preferably the ECC scheme can be dynamically enabled or disabled. This allows the extra DRAM 904E to be substituted for one of the other DRAMs 904A, 904B, 904C and 904D if one of them should become damaged beyond the ability of whatever in-field repair capability is available to correct.

Figure 9B:
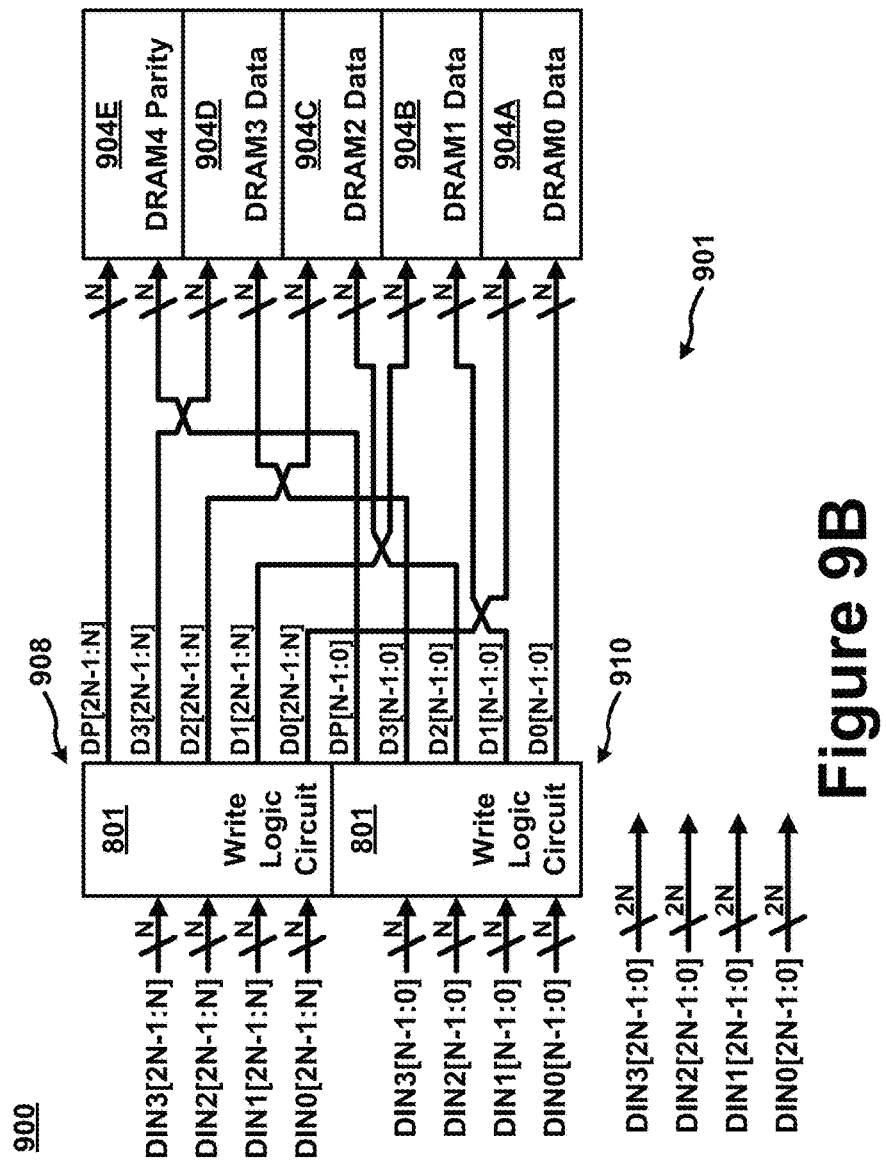

FIG. 9B illustrates an exemplary write logic circuit 901 for implementing the full stack ECC scheme in stacked memory device 900. The figure shows a portion of the stacked memory device 900 including DRAM ICs 904A, 904B, 904C, 904D and 904E and two instances of write logic circuit 801 from FIG. 8B (labeled and henceforth referred to as 908 and 910). Stacked memory device 900 further comprises four 2N-bit wide external data input busses DIN0[2N−1:0], DIN1[2N−1:0], DIN2[2N−1:0] and DIN3[2N−1:0]. DRAM ICs 904A, 904B, 904C, 904D and 904E may be identical to the DRAM ICs 804A, 804B, 804C, 804D and 804E in FIGS. 8A, 8B and 8C differently configured to accept a 2N-bit data word, or a different type of DRAM IC with the width 2N-bit data word as a matter of design choice. The value of N itself is also a matter of design choice.

Each of the 2N-bit wide external data input busses DIN0[2N−1:0], DIN1[2N−1:0], DIN2[2N−1:0] and DIN3[2N−1:0] are each partitioned into pairs of N-bit wide external data input sub-busses DIN0[2N−1:N] and DIN0[N−1:0], DIN1[2N−1:N] and DIN1[N−1:0], DIN2[2N−1:N] and DIN2[N−1:0], and DIN3[2N−1:N] and DIN3[N−1:0] respectively. The external data input sub-busses DIN0[2N−1:N], DIN1[2N−1:N], DIN2[2N−1:N] and DIN3[2N−1:N] comprising the most significant bits (MSBs) are coupled to write logic circuit 908, while the external data input sub-busses DIN0[N−1:0], DIN1[N−1:0], DIN2[N−1:0] and DIN3[N−1:0] comprising the least significant bits (LSBs) are coupled to write logic circuit 910. Thus the data words are broken up into data sub-words by the data sub-busses.

Write logic circuit 908 passes the input MSB data from the external data input sub-busses DIN0[2N−1:N], DIN1[2N−1:N], DIN2[2N−1:N] and DIN3[2N−1:N] through to write data sub-busses D0[2N−1:N], D1[2N−1:N], D2[2N−1:N] and D3[2N−1:N] respectively, which are in turn coupled to the MSB data inputs of data DRAM ICs 904A, 904B, 904C and 904D respectively. Write logic circuit 908 also generates the bit-by-bit parity data and presents it on write parity sub-bus DP[2N−1:N] which is coupled to the MSB data inputs of parity DRAM IC 904E.

In a similar manner, write logic circuit 910 passes the input LSB data from the external data input sub-busses DIN0[N−1:0], DIN1[N−1:0], DIN2[N−1:0] and DIN3[N−1:0] through to write data sub-busses D0[N−1:0], D1[N−1:0], D2[N−1:0] and D3[N−1:0] respectively, which are in turn coupled to the LSB data inputs of data DRAM ICs 904A, 904B, 904C and 904D respectively. Write logic circuit 910 also generates the bit-by-bit parity data and presents it on write parity sub-bus DP[2N−1:N] which is coupled to the LSB data inputs of parity DRAM IC 904E.

As was the case in stacked memory device 800, all of the data busses (as well as the data sub-busses) in stacked memory device 900 maintain bit order from MSB to LSB throughout. Notice that just as the busses and sub-busses are partitioned, write logic circuit 901 itself is also partitioned into write logic circuits 908 and 910 which process the MSB sub-busses and LSB sub-busses respectively. While read logic circuit 901 shows two data partitions, the actual number is a matter of design choice.

Figure 9C:
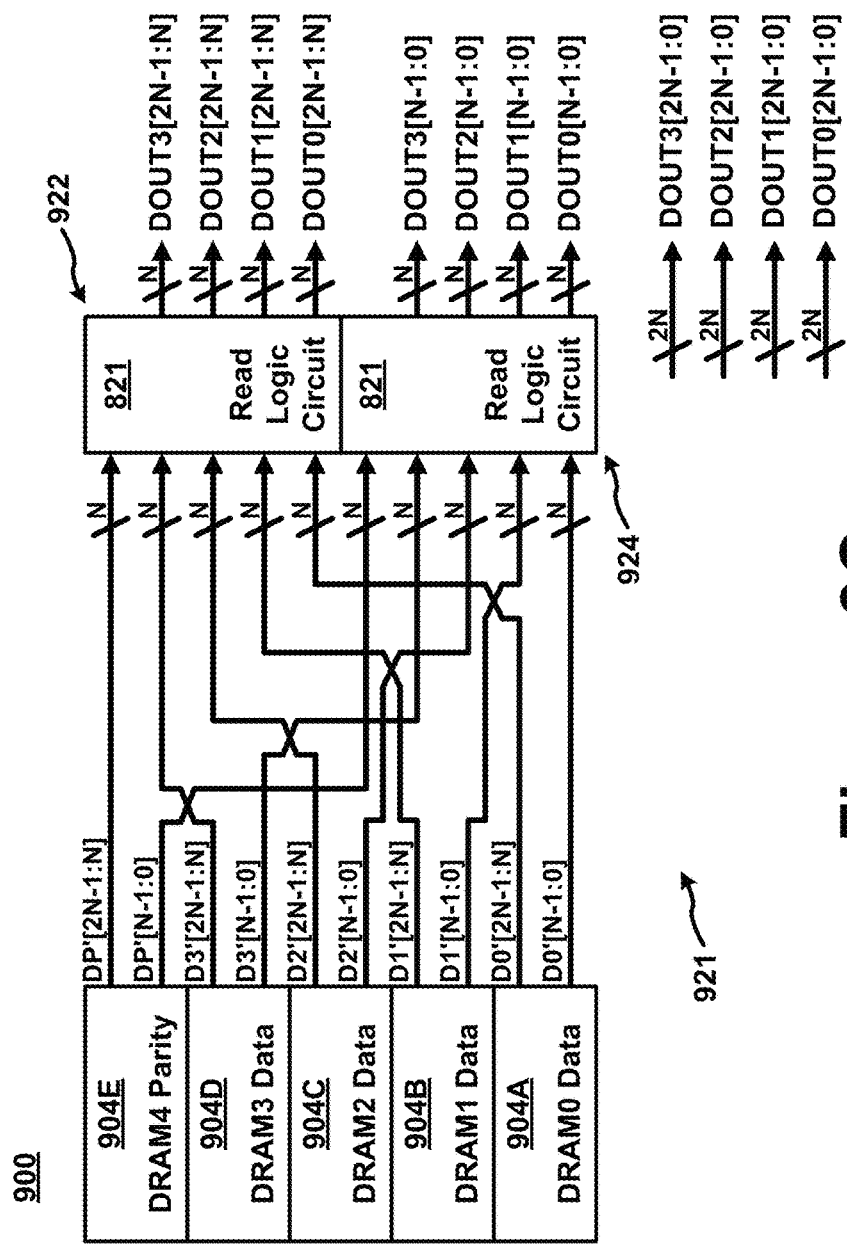

FIG. 9C illustrates an exemplary read logic circuit 921 for implementing the full stack ECC scheme in stacked memory device 900. The figure shows a portion of the stacked memory device 900 including DRAM ICs 904A, 904B, 904C, 904D and 904E and two instances of read logic circuit 821 from FIG. 8B (labeled and henceforth referred to as 922 and 924). Stacked memory device 900 further comprises four 2N-bit external data output busses DOUT0[2N−1:0], DOUT1[2N−1:0], DOUT2[2N−1:0] and DOUT3[2N−1:0].

Each of the 2N-bit wide external data output busses DOUT0[2N−1:0], DOUT1[2N−1:0], DOUT2[2N−1:0] and DOUT3[2N−1:0] are partitioned into two N-bit external data output sub-busses DOUT0[2N−1:N] and DOUT0[N−1:0], DOUT1[2N−1:N] and DOUT1[N−1:0], DOUT2[2N−1:N] and DOUT2[N−1:0], and DOUT3[2N−1:N] and DOUT3[N−1:0] respectively. The external data output sub-busses DOUT0[2N−1:N], DOUT1[2N−1:N], DOUT2[2N−1:N] and DOUT3[2N−1:N] comprising the most significant bits (MSBs) are coupled to read logic circuit 922, while the external data output sub-busses DOUT0[N−1:0], DOUT1[N−1:0], DOUT2[N−1:0] and DOUT3[N−1:0] comprising the least significant bits (LSBs) are coupled to read logic circuit 924.

DRAM ICs 904A, 904B, 904C, 904D and 904E are coupled to read logic circuit 922 though read data sub-busses D0'[2N−1:N], D1'[2N−1:N], D2'[2N−1:N], D3'[2N−1:N] and DP'[2N−1:N] respectively. Similarly, DRAM ICs 904A, 904B, 904C, 904D and 904E are coupled to read logic circuit 924 though read data sub-busses D0'[N−1:0], D1'[N−1:0], D2'[N−1:0], D3'[N−1:0] and DP'[N−1:0] respectively. Each of the 10 read data sub-busses is accompanied by a no-error control signal coupled from the same DRAM IC to the read logic circuit. These are not shown in FIG. 9C to avoid cluttering the diagram. These no-error signals perform substantially the same function in the two read logic circuits 922 and 924 as they did in read logic circuit 821 in FIG. 8C.

Since the read logic circuit 921 is partitioned into two smaller read logic circuits 922 and 924, errors in two data sub-words can be corrected in parallel: one in the MSB read data sub-words and one in the LSB read data sub-words. While the read logic circuit shows two data partitions, the actual number is a matter of design choice. Each additional partition requires an additional instance of read logic circuit 821, appropriate division of the data busses into sub-data busses, and a no-error signal for each read data sub-bus.

While stacked memory device 900 is shown with unidirectional busses and sub-busses, those skilled in the art will realize that most DRAM memories utilize bidirectional data busses externally (and often internally) and that stacked memory device 900 could also be implemented in such a manner. For example, the 2N-bit wide external data input busses DIN0[2N−1:0], DIN1[2N−1:0], DIN2[2N−1:0] and DIN3[2N−1:0] may share the same physical wires as external data output busses DOUT0[2N−1:0], DOUT1[2N−1:0], DOUT2[2N−1:0] and DOUT3[2N−1:0] respectively. Similarly, the write data sub-busses D0[2N−1:N], D1[2N−1:N, D2[2N−1:N], D3[2N−1:N], D0[N−1:0], D1[N−1:0], D2[N−1:0] and D3[N−1:0] may share the same physical wires as the read data sub-busses D0'[2N−1:N], D1'[2N−1:N], D2'[2N−1:N], D3'[2N−1:N], DP'[2N−1:N], D0'[N−1:0], D1'[N−1:0], D2'[N−1:0], D3'[N−1:0] and DP'[N−1:0] respectively. In such cases, the circuitry may be modified slightly to accomplish the bidirectional function using circuit techniques well known in the art.

DRAM ICs 904A, 904B, 904C, 904D and 904E each comprise a plurality of address locations which have not been illustrated in the figures to avoid overly complicating the disclosure with circuits that are well known in the art. In describing the write logic circuit 901 and read logic circuit 921, the write and read operations described apply to one particular address in all of the DRAM ICs 904A, 904B, 904C, 904D and 904E. The write operation encodes the data for a particular set of input data words, the parity bits generated are unique to each set of data words, the read operation corrects any errors in that same particular set of data words using those same unique parity bits, and this is true for every set of data words at every address in stacked memory device 800.

Figure 10A:
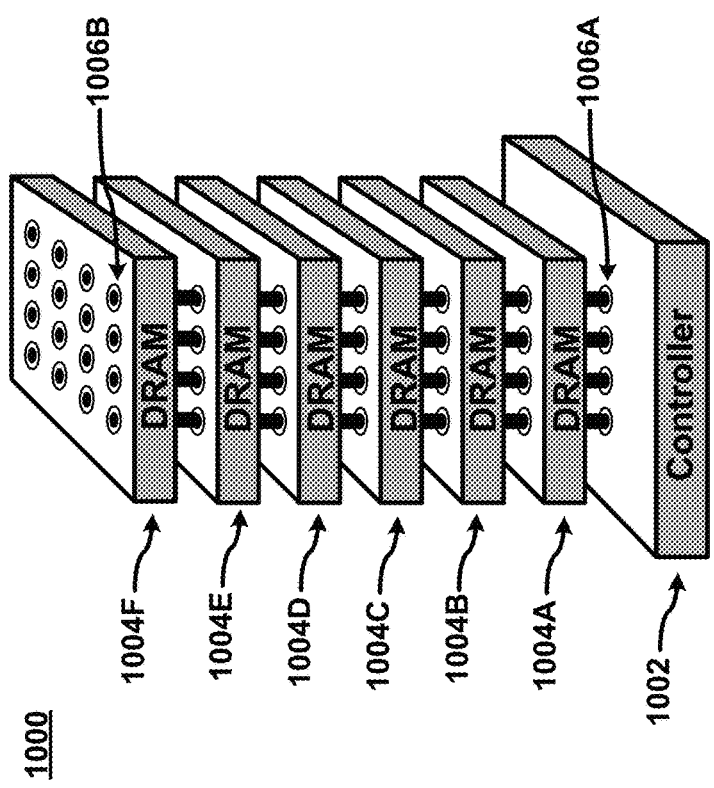
FIGS. 10A, 10B and 10C illustrate different aspects of a third embodiment of a stacked memory device according to the present invention.

FIG. 10A illustrates an abstraction of an exemplary stacked memory device 1000 according to the present invention. Stacked memory device 1000 comprises a single package (not shown) with a base logic IC 1002 and six stacked DRAM ICs 1004A, 1004B, 1004C, 1004D, 1000E and 1004F. Controller IC 1002 and DRAM ICs 1004A, 1004B, 1004C, 1004D, 1000E and 1004F are electrically coupled together vertically using Through Silicon Via (TSV) interconnects, an exemplary one of which couples to controller IC 1002 at 1006A, couples to the top DRAM IC 1004E at 1006B, and couples to DRAM ICs 1004A, 1004B, 1004C, 1000D and 1004E in between. Those skilled in the art will realize that other technologies besides TSV could be used for interconnection in stacked memory device 1000.

Compared to prior art devices like DRAM IC 400 in FIG. 4, stacked memory device 1000 comprises two additional DRAM ICs 1004E and 1000F which increases the memory capacity to provide room to store two bits of bit-by-bit parity data for the other DRAMs in the stack. This parity data is used to implement a full stack ECC scheme in a manner analogous to a RAID 6 disk array. This provides additional reliability beyond whatever other reliability features are provided on DRAM ICs 1004A, 1004B, 1004C, 1004D, 1000E and 1004F and/or on controller 1002.

Two additional DRAM ICs are required for a stack of any height. Preferably the ECC scheme can be dynamically enabled or disabled. This allows the extra DRAM ICs 1004E and 1000F to be substituted for one of the other DRAMs 1004A, 1004B, 1004C and 1004D if one or two of them should become damaged beyond the ability of whatever in-field repair capability is available to correct. If only one DRAM IC is damaged, the stacked memory device 1000 may be operated in a manner substantially similar to stacked memory device 800 of FIG. 8A, FIG. 8B and FIG. 8C and stacked memory device 900 of FIG. 9A, FIG. 9B and FIG. 9C.

Figure 10B:
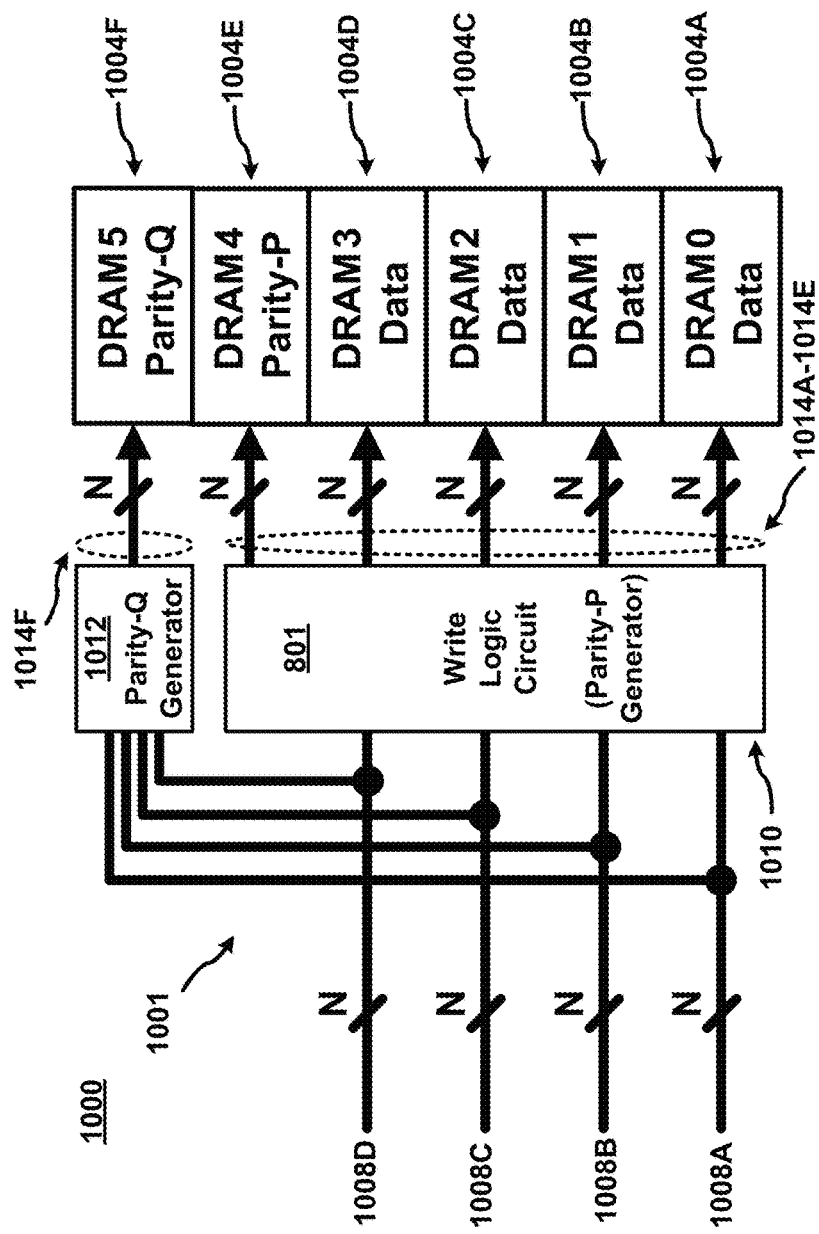

FIG. 10B illustrates an exemplary write logic circuit 1001 for implementing the full stack ECC scheme in stacked memory device 1000. The figure shows a portion of the stacked memory device 1000 including DRAM ICs 1004A, 1004B, 1004C, 1004D, 1000E and 1004F an instance of write logic circuit 801 from FIG. 8B (labeled and henceforth referred to as 1010), and Parity-Q generator circuit 1012. Stacked memory device 1000 further comprises N-bit wide external data input busses 1008A, 1008B, 1008C and 1008D that are coupled to write logic circuit 1010 and Parity-Q generator circuit 1012.

As write logic circuits 801, 908 and 910 did in FIGS. 8B and 9B, write logic circuit 1010 generates the bit-by-bit parity word (known in this context as Parity-P) which it then sends to Parity-P DRAM IC 1004E through write parity bus 1014E, while sending the write data input on N-bit wide external data busses 1008A, 1008B, 1008C and 1008D to data DRAM ICs 1004A, 1004B, 1004C and 1004D respectively through write data busses 1014A, 1014B, 1014C and 1014D respectively.

Parity-Q generator circuit 1012 performs a second type of parity calculation which is a shifted version of the input data words to produce the Parity-Q data word, typically by means of a linear feedback shift register (LFSR) circuit not shown in detail. Different ways of calculating Parity-Q are known in the art. Parity-Q generator circuit 1012 sends the Parity-Q data word to Parity-Q DRAM IC 1004F through write parity bus 1014F. As was the case in stacked memory devices 800 and 900, all of the busses in stacked memory device 1000 maintain bit order from MSB to LSB throughout.

Figure 10C:
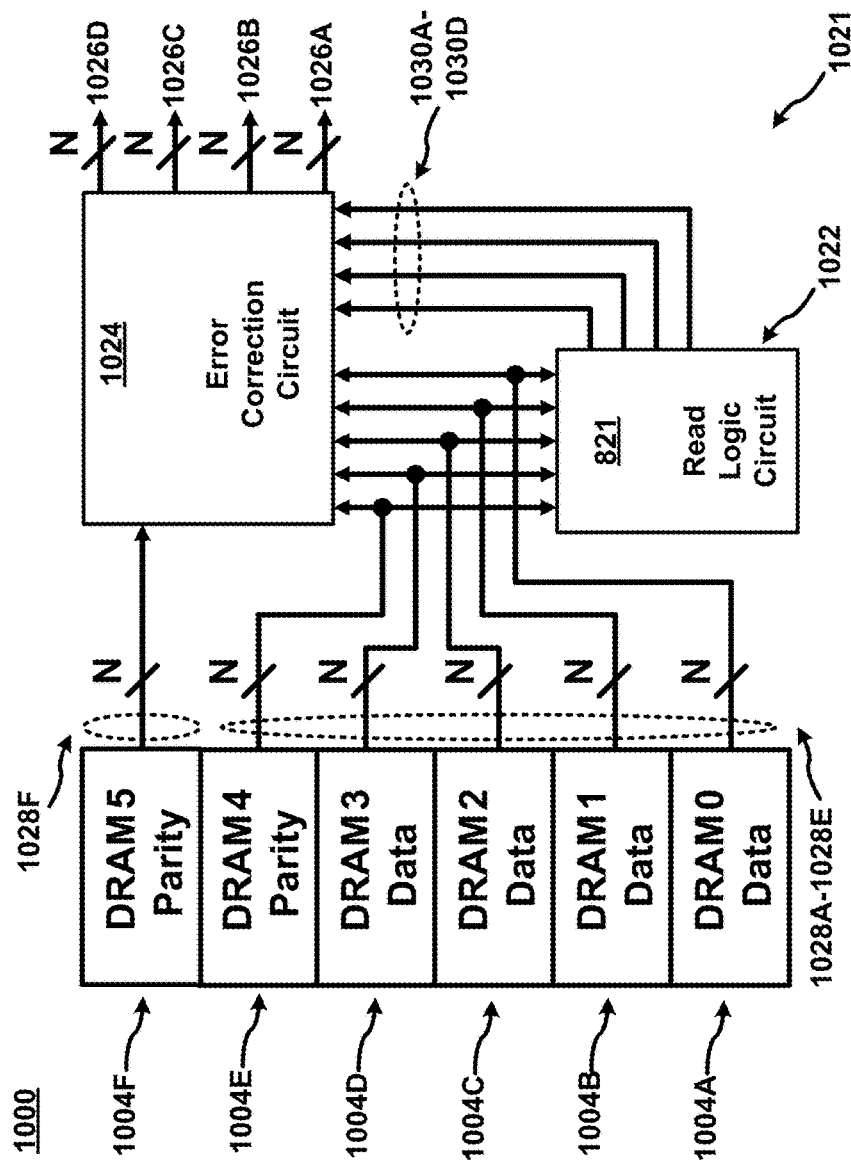

FIG. 10C illustrates an exemplary read logic circuit 1021 for implementing the full stack ECC scheme in stacked memory device 1000. The figure shows a portion of the stacked memory device 1000 including DRAM ICs 1004A, 1004B, 1004C, 1004D, 1004E and 1004F, an instance of read logic circuit 821 from FIG. 8C (labeled and henceforth referred to as 1022), and error correction circuit 1024. Stacked memory device 1000 further comprises four N-bit external output data busses 1026A, 1026B, 1026C and 1026D each coupled to error correction circuit 1024.

DRAM ICs 1004A, 1004B, 1004C, 1004D, 1004E and 1004F are coupled to error correction circuit 1024 through N-bit read data busses 1028A, 1028B, 1028C and 1028D, and N-bit read parity busses 1028E and 1028F. DRAM ICs 1004A, 1004B, 1004C, 1004D and 1004E are further coupled to read logic circuit 1022 through N-bit read data busses 1028A, 1028B, 1028C and 1028D, and read parity bus 1028E. Read logic circuit 1022 is coupled to error correction circuit 1024 through N-bit corrected data busses 1030A, 1030B, 1030C and 1030D. There are six no-error signals, each associated with each of the N-bit read data busses 1028A, 1028B, 1028C, 1028D, 1028E and 1028F that are all coupled to both read logic circuit 1022 and error correction circuit 1024.

Read logic circuit 1021 can correct a 1-bit error in up to two different words on N-bit read data busses 1028A, 1028B, 1028C and 1028D and read parity busses 1028E and 1028F. There are seven different cases: [1] no error, [2] one error in a data DRAM IC, [3] one error in a parity DRAM IC, [4] two errors in the two parity DRAM ICs, [5] two errors, one in a data DRAM IC and one in the Parity-Q DRAM IC, [6] one in a data DRAM IC and one in the Parity-P DRAM IC, and [7] two errors in two data DRAM ICs.

In case 1 (no error), no correction is needed so the read data on N-bit read data busses 1028A, 1028B, 1028C and 1028D are gated to the N-bit external output data busses 1026A, 1026B, 1026C and 1026D respectively by read logic circuit 1021.

In case 2 (one error in a data DRAM IC), read logic circuit 1022 corrects the error substantially as described in conjunction with FIG. 8C by read correct logic circuit 1022 and the corrected data word on the N-bit corrected data busses 1030A, 1030B, 1030C and 1030D is gated to the N-bit external output data busses 1026A, 1026B, 1026C and 1026D respectively by error correction circuit 1024.

In case 3 (one error in a parity DRAM IC), no correction is needed so the read data on N-bit read data busses 1028A, 1028B, 1028C and 1028D are gated to the N-bit external output data busses 1026A, 1026B, 1026C and 1026D respectively by read logic circuit 1021.

In case 4 (two errors in the two parity DRAM ICs), no correction is needed so the read data on N-bit read data busses 1028A, 1028B, 1028C and 1028D are gated to the N-bit external output data busses 1026A, 1026B, 1026C and 1026D respectively by read logic circuit 1021.

In case 5 (two errors, one in a data DRAM IC and one in the Parity-Q DRAM IC), read logic circuit 1022 corrects the error substantially as described in conjunction with FIG. 8C by read correct logic circuit 1022 and the corrected data word on the N-bit corrected data busses 1030A, 1030B, 1030C and 1030D is gated to the N-bit external output data busses 1026A, 1026B, 1026C and 1026D respectively by error correction circuit 1024.

In case 6 (one in a data DRAM IC and one in the Parity-P DRAM IC), read logic circuit 1022 cannot correct the data error, so error correction circuit 1024 must use an algorithm known in the art to correct the data DRAM IC error from the Parity-Q data and the correct data from the other data DRAM ICs. The particular algorithm employed is a matter of design choice made in conjunction with the design of Parity-Q generator 1012 in FIG. 10B. After the corrections are made, the corrected data word is gated to the N-bit external output data busses 1026A, 1026B, 1026C and 1026D.

In case 7 (two errors in two data DRAM ICs), read logic circuit 1022 cannot correct either of the errors, so error correction circuit 1024 must use an algorithm known in the art to correct the data DRAM IC error from the Parity-P data, the Parity-Q data, and the correct data from the other data DRAM ICs. The particular algorithm employed is a matter of design choice made in conjunction with the design of Parity-Q generator 1012 in FIG. 10B. After the corrections are made, the corrected data words are gated to the N-bit external output data busses 1026A, 1026B, 1026C and 1026D.

Persons skilled in the art will realize that read logic circuit 1021 may be implemented in many different ways. For example, read logic circuit 1022 and error correction circuit 1024 may be merged together into a single read logic circuit in some embodiments. Different implementations will produce substantially identical behavior when viewed externally to stacked memory device 1000 and all fall within the scope of the present invention.

While stacked memory device 1000 is shown with unidirectional external data input and output busses, those skilled in the art will realize that most DRAM memories utilize bidirectional data busses externally (and often internally) and that stacked memory device 1000 could also be implemented in such a manner. For example, N-bit wide external data input busses 1008A, 1008B, 1008C and 1008D and the N-bit external data output busses 1026A, 1026B, 1026C and 1026D respectively may share the same physical wires. In such cases, the circuitry may be modified slightly to accomplish the bidirectional functionality using circuit techniques well known in the art.

DRAM ICs 1004A, 1004B, 1004C, 1004D, 1004E and 1004F each comprise a plurality of address locations which have not been illustrated in the figures to avoid overly complicating the disclosure with circuits that are well known in the art. In describing the write logic circuit 1001 and read logic circuit 1021, the write and read operations described apply to one particular address in all of the DRAM ICs 1004A, 1004B, 1004C, 1004D, 1004E and 1004F. The write operation encodes the data for a particular set of input data words, the parity bits generated are unique to each set of data words, the read operation corrects any errors in that same particular set of data words using those same unique parity bits, and this is true for every set of data words at every address in stacked memory device 1000.

Figure 11:
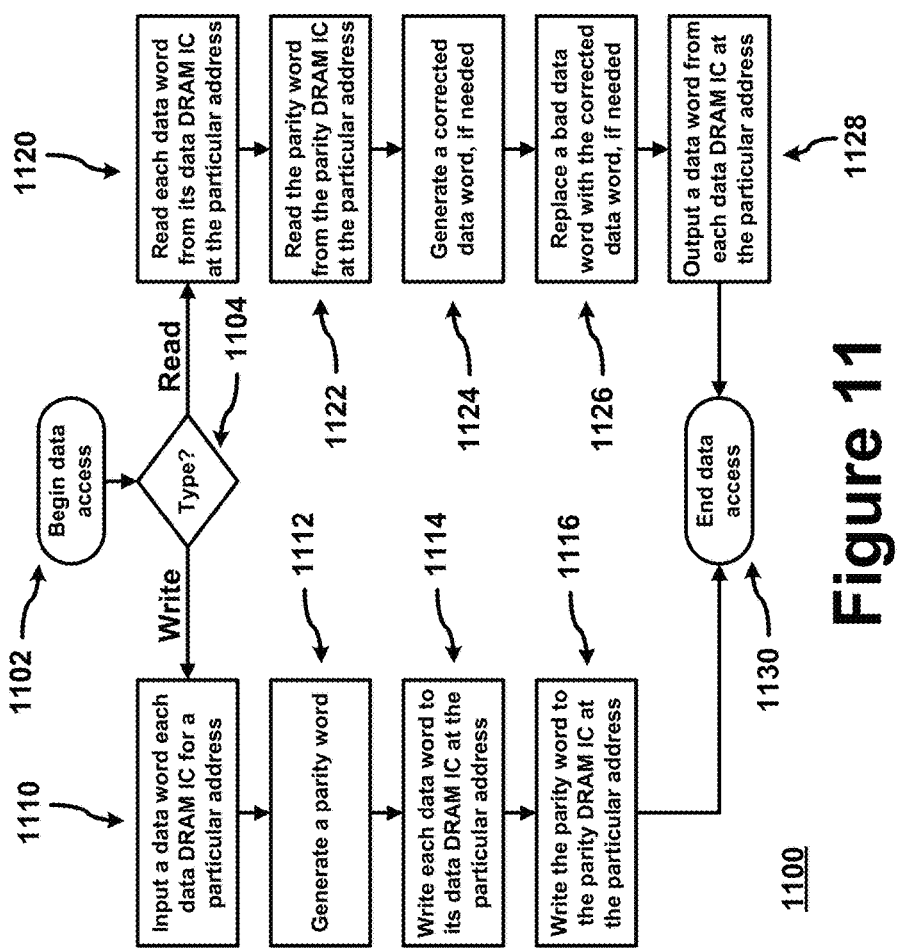
FIG. 11 illustrates a first method of use of a stacked memory device according to the present invention.

FIG. 11 illustrates a flowchart 1100 of a method of operating a stacked memory device according to the present invention. The method of flowchart 1100 is suitable for use with embodiments of the invention like, for example, stacked memory device 800 of FIGS. 8A, 8B and 8C and stacked memory device 900 of FIGS. 9A, 9B and 9C, but may also be used with other embodiments not described in this disclosure. It may also be used with stacked memory device 1000 of FIGS. 10A, 10B and 10C when operating with only one parity memory integrated circuit, like, for example, if one of the DRAM integrated circuits were damaged beyond repair and operating in the two parity memory configuration was no longer possible.

The method of flowchart 1100 begins with step 1102 in which an access operation is started, which is typically accompanied by a particular address where the data is to be written to or read from.

The method continues with step 1104 in which it is determined if the access operation is a write operation or a read operation. Persons skilled in the art will realize that beginning a read or a write operation will typically be done in the host software and/or in a memory controller which interfaces between the host and the stacked memory device. This memory controller may or may not be internal to the device package depending on the embodiment of the invention as a matter of design choice. Such skilled persons will realize that in some embodiments steps 1102 and 1104 may be in the order shown, substantially simultaneous and in some cases step 1104 may even precede step 1102. Such skilled persons will also realize that all such combinations are within the scope of the invention.

If the operation is a write operation, the method continues with step 1110 which inputs the write data into the stacked memory device by providing a data word associated with each data memory integrated circuit in the device.

In step 1112 a parity operation on the write data words is performed to generate a parity word.

In step 1114 writes the write data words provided to their associated data memory integrated circuits.

In step 1116 the parity word is written into the parity memory integrated circuit. Steps 1114 and 1116 may occur substantially simultaneously or in either order as a matter of design choice.

The access ends with the completion of the write access operation in step 1130.

If the operation is a read operation, then the method continues with step 1120 in which the stored data words are read from their associated data memory integrated circuits.

In step 1122 the parity word is read from the parity memory integrated circuit. Steps 1120 and 1122 may occur substantially simultaneously or in either order as a matter of design choice.

In step 1124 a parity operation is performed on the read data words and the parity word to generates a corrected data word, if needed. Persons skilled in the art will realize that in some embodiments the parity calculation will always be performed while in others it will only occur when an error is actually detected. Such skilled persons will realize that there are many ways the parity calculation and its underlying read logic circuit may be implemented as a matter of design choice. For example, one design might automatically perform the parity calculation, whether it is needed or not, for simplicity. Another design might only perform the parity calculation when needed, and shut down the parity circuitry the rest of the time to save power. These and other possible design choices in different embodiments will ultimately provide substantially the same behavior as observed from outside the stacked memory device, and all these variations on the parity calculation in the read logic circuit should be considered within the scope of the invention.

In step 1126 a single bad data word is replaced with a corrected version of that data word, if generated or if needed. The details of how this step is performed in hardware is related to the design choices made and discussed with respect to step 1124. Here as well the design choices in different embodiments will ultimately provide substantially the same behavior as observed from outside the stacked memory device, and all should be considered within the scope of the invention.

In step 1128 the correct data word from each data memory integrated circuit is output from the stacked memory device.

The access ends with the completion of the read access operation in step 1130.

Figure 12:
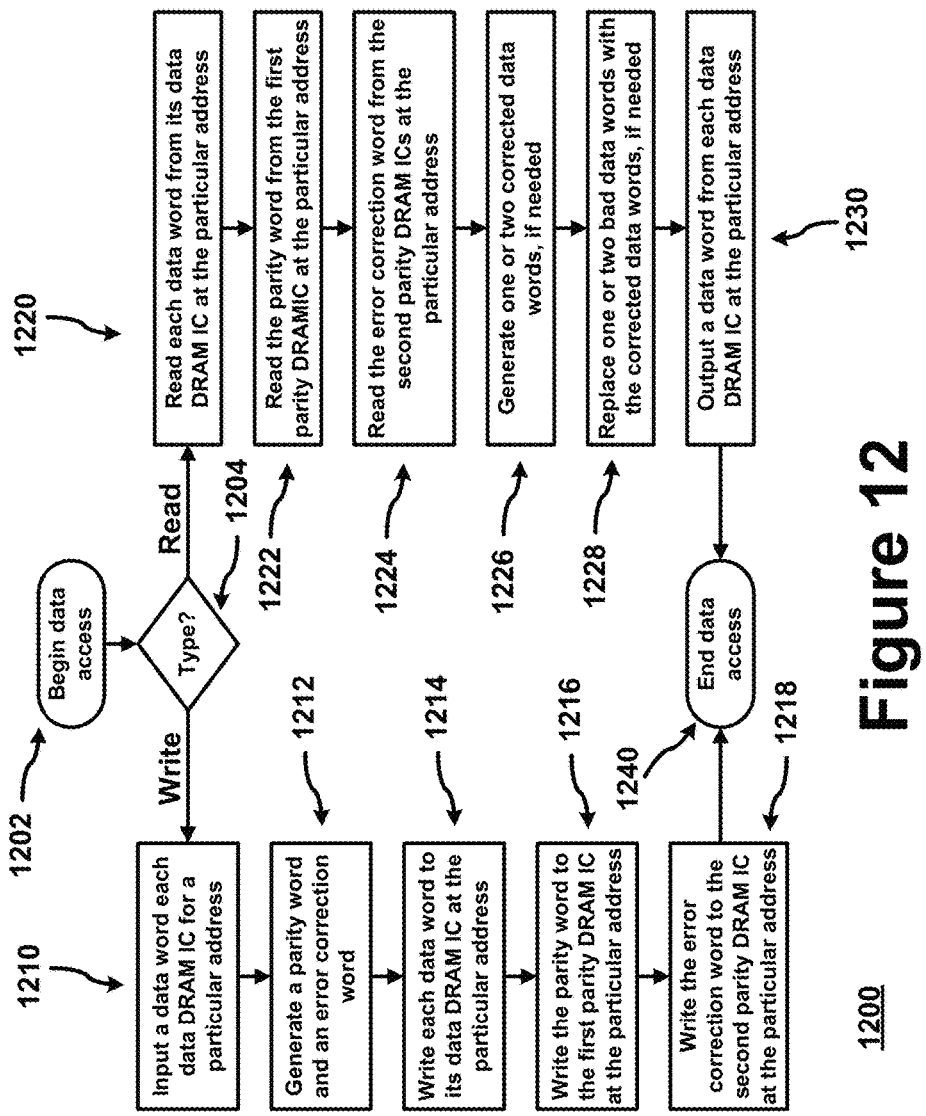
FIG. 12 illustrates a second method of use of a stacked memory device according to the present invention.

FIG. 12 illustrates a flowchart 1200 of a method of operating a stacked memory device according to the present invention. The method of flowchart 1200 is suitable for use with embodiments of the invention like, for example, stacked memory device 1000 of FIG. 10A, FIG. 10B, but may also be used with other embodiments not described in this disclosure.

The method of flowchart 1200 begins with step 1202 in which an access operation is started, which is typically accompanied by a particular address where the data is to be written to or read from.

The method continues with step 1204 in which it is determined if the access operation is a write operation or a read operation. Persons skilled in the art will realize that beginning a read or a write operation will typically be done in the host software and/or in a memory controller which interfaces between the host and the stacked memory device. This memory controller may or may not be internal to the device package depending on the embodiment of the invention as a matter of design choice. Such skilled persons will realize that in some embodiments steps 1202 and 1204 may be in the order shown, substantially simultaneous and in some cases step 1204 may even precede step 1202. Such skilled persons will also realize that all such combinations are within the scope of the invention.

If the operation is a write operation, the method continues with step 1210 in which the write data is input into the stacked memory device by providing a data word associated with each data memory integrated circuit in the device.

In step 1212 a parity operation on the write data words is performed to generate a parity word and a data correction word.

In step 1214 the write data words are written to their associated data memory integrated circuits.

In step 1216 the parity word is written into the first parity memory integrated circuit.

In step 1218 the error correction word is written into the second parity memory integrated circuit. Steps 1214, 1216 and 1218 may occur substantially simultaneously or in any order as a matter of design choice.

The access ends with the completion of the write access operation in step 1240.

If the operation is a read operation, then the method continues with step 1220 in which the stored data words are read from their associated data memory integrated circuits.

In step 1222 the parity word is read from the first parity memory integrated circuit.

In step 1224 the error correction word is read from the second parity memory integrated circuit. Steps 1220, 1222 and 1224 may occur substantially simultaneously or in any order as a matter of design choice.

In step 1226 a parity operation is performed on the read data words, the parity word, and the error correction word to generate one or two corrected data words, if needed. Persons skilled in the art will realize that in some embodiments the parity calculation will always be performed while in others it will only occur when an error is actually detected. Such skilled persons will realize that there are many ways the parity calculation and its underlying read logic circuit may be implemented as a matter of design choice. For example, one design might automatically perform the parity calculation, whether it is needed or not, for simplicity. Another design might only perform the parity calculation when needed, and shut down the parity circuitry the rest of the time to save power. These and other possible design choices in different embodiments will ultimately provide substantially the same behavior as observed from outside the stacked memory device, and all these variations on the parity calculation in the read logic circuit should be considered within the scope of the invention.

In step 1228 one or two bad data words are replaced with a corrected version of that data word, if generated or if needed. The details of how this step is performed in hardware is related to the design choices made and discussed with respect to step 1224, and here as well the design choices in different embodiments will ultimately provide substantially the same behavior as observed from outside the stacked memory device, and all should be considered within the scope of the invention.

In step 1230 the correct data word from each data memory integrated circuit is output from the stacked memory device.

The access ends with the completion of the read access operation in step 1240.

While the exemplary embodiments and methods described herein have been based on stacked memory devices comprising DRAM integrated circuits, the invention may also be applicable to other memory technologies and employed there as well as a matter of design choice.

Those of ordinary skill in the art will realize that the above figures and descriptions are exemplary only. Many other embodiments will readily suggest themselves to such skilled persons after reviewing this disclosure. Thus the invention is not to be limited in any way except by the issued claims.

What is claimed is:

1. A memory device comprising:
    a controller integrated circuit (IC), further comprising:
        an external data bus,
        a write logic circuit coupled to the external data bus, and
        a read logic circuit coupled to the external data bus;
    a plurality of data memory integrated circuits (ICs) coupled to the write logic circuit and to the read logic circuit; and
    a first parity memory IC coupled to the write logic circuit and to the read logic circuit, wherein the parity memory is configured to selectively operate as one of the group comprising: a parity memory and a data memory.

2. The memory device of claim 1, wherein the controller IC further comprises a logic circuit that selects between operating the first parity IC operating as one of the group comprising: a parity memory and a data memory.

3. The memory device of claim 2, wherein:
    the logic circuit selectively operates the first parity memory IC as a parity memory when all of the plurality of data memory ICs are undamaged, and
    the logic circuit selectively operates the first parity memory IC as a data memory when one of the plurality of data memory ICs is damaged.

4. The memory device of claim 3, wherein the external data bus comprises:
    an external write data bus coupled to the write logic circuit, and
    an external read data bus coupled to the read logic circuit.

5. The memory device of claim 1, further comprising:
    a second parity memory IC coupled to the write logic circuit and to the read logic circuit, wherein the parity memory is configured to selectively operate as one of the group comprising: a parity memory and a data memory.

6. The memory device of claim 5, wherein:
    the logic circuit selectively operates the second parity memory IC as a parity memory when all of the plurality of data memory ICs and the first parity memory IC are undamaged, and
    the logic circuit selectively operates the second parity memory IC as a data memory when one of the plurality of data memory ICs and the first parity memory IC is damaged.

7. The memory device of claim 6, wherein:
    the logic circuit selectively operates the first parity memory IC and the second parity memory IC as parity memories when all of the plurality of data memory ICs are undamaged, and
    the logic circuit selectively operates the first parity memory IC as a data memory and the second parity memory IC as a parity memory when one of the plurality of data memory ICs is damaged.

8. The memory device of claim 7, wherein the external data bus comprises:
    an external write data bus coupled to the write logic circuit, and
    an external read data bus coupled to the read logic circuit.

9. A memory device comprising:
    a controller integrated circuit (IC), further comprising:
        an external data bus,
        a write logic circuit coupled to the external data bus, and
        a read logic circuit coupled to the external data bus; and
    a plurality of N+1 memory integrated circuits (ICs) coupled to the write logic circuit and to the read logic circuit wherein:
        N is an integer,
        each memory IC has a data word width of W bits wherein W is an integer,
        the external data bus has a data word width of D bits wherein D=N*W, and
        each memory IC is organized into at least two partitions, wherein:
            each partition comprises one or more addresses and is associated with a partition of the same number of addresses on each of the other N memory ICs creating at least two groups of N+1 partitions,
            each group has one parity partition and N data partitions, and
            the parity partitions of two groups are physically located on a different one of the N+1 memory ICs.

10. The memory device of claim 9, wherein:
each memory IC is organized into at least N+1 partitions, wherein:
there are at least N+1 groups of N+1 partitions, and
each group has one parity partition and N data partitions, and
the parity partitions of N+1 groups are physically located on a different one of the N+1 memory ICs.

11. The memory device of claim 10, wherein the external data bus comprises:
an external write data bus of data word width D coupled to the write logic circuit, and
an external read data bus of data word width D coupled to the read logic circuit.

12. The memory device of claim 9, wherein the external data bus comprises:
an external write data bus of data word width D coupled to the write logic circuit, and
an external read data bus of data word width D coupled to the read logic circuit.

13. A stack of memory integrated circuits comprising a plurality of N+1 memory integrated circuits (ICs) coupled together by a plurality signal lines, wherein:
N is an integer;
each memory IC is organized into at least two partitions, wherein:
each partition comprises one or more addresses and is associated with a partition of the same number of addresses on each of the other N memory ICs creating at least two groups of N+1 partitions,
each group has one parity partition and N data partitions, and
the parity partitions of two groups are physically located on a different one of the N+1 memory ICs; and
the stack of N+1 memory ICs is configured to be operable when coupled to a controller integrated circuit.

14. The stack of memory integrated circuits of claim 13, wherein:
each memory IC is organized into at least N+1 partitions, wherein:
each partition comprises one or more addresses and is associated with a partition of the same number of addresses on each of the other N memory ICs creating at least N+1 groups of N+1 partitions,
each group has one parity partition and N data partitions, and
the parity partitions of N+1 groups are physically located on a different one of the N+1 memory ICs.

15. The stack of memory integrated circuits of claim 14, wherein a controller IC is coupled to the stack of memory ICs and packaged together with them as a single device.

16. The stack of memory integrated circuits of claim 15, wherein the controller integrated circuit, further comprises:
an external data bus,
a write logic circuit coupled to the external data bus, and
a read logic circuit coupled to the external data bus.

17. The memory device of claim 16, wherein the external data bus comprises:
an external write data bus coupled to the write logic circuit, and
an external read data bus coupled to the read logic circuit.

* * * * *